(12) United States Patent
Yoon et al.

(10) Patent No.: US 9,923,157 B2
(45) Date of Patent: Mar. 20, 2018

(54) METHOD OF MANUFACTURING FLEXIBLE DISPLAY

(71) Applicant: Samsung Display Co., Ltd., Yongin-si, Gyeonggi-do (KR)

(72) Inventors: Seungho Yoon, Yongin-si (KR); Eunjeong Cho, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 89 days.

(21) Appl. No.: 15/178,392

(22) Filed: Jun. 9, 2016

(65) Prior Publication Data

US 2017/0047534 A1 Feb. 16, 2017

(30) Foreign Application Priority Data

Aug. 10, 2015 (KR) .................. 10-2015-0112673

(51) Int. Cl.
| | |
|---|---|
| *B29C 65/52* | (2006.01) |
| *B32B 37/12* | (2006.01) |
| *B32B 37/24* | (2006.01) |
| *B32B 38/04* | (2006.01) |
| *B32B 38/10* | (2006.01) |
| *B32B 43/00* | (2006.01) |

(Continued)

(52) U.S. Cl.
CPC ........ *H01L 51/0097* (2013.01); *B32B 37/025* (2013.01); *B32B 38/10* (2013.01); *H01L 51/003* (2013.01); *H01L 51/56* (2013.01); *B32B 2310/0843* (2013.01); *B32B 2457/20* (2013.01); *H01L 27/3244* (2013.01); *H01L 2227/323* (2013.01); *H01L 2227/326* (2013.01); *H01L 2251/5338* (2013.01)

(58) Field of Classification Search
USPC ... 156/247, 250, 306.3, 307.1, 307.3, 307.7, 156/701, 711, 712, 717
See application file for complete search history.

(56) References Cited

U.S. PATENT DOCUMENTS

| | | | |
|---|---|---|---|
| 6,787,990 B2 * | 9/2004 | Cok ................... | H01R 12/7076 313/499 |
| 7,129,911 B2 * | 10/2006 | Stephenson ....... | G02F 1/134327 345/33 |

(Continued)

FOREIGN PATENT DOCUMENTS

| | | |
|---|---|---|
| JP | 2008-292608 A | 12/2008 |
| KR | 10-2009-0114195 A | 11/2009 |

(Continued)

*Primary Examiner* — Sing P Chan
(74) *Attorney, Agent, or Firm* — Knobbe, Martens, Olson & Bear, LLP

(57) ABSTRACT

A method of manufacturing a flexible display is disclosed. In one aspect, the method includes preparing a carrier comprising a first region and a second region surrounding the first region, forming a first substrate forming layer over at least the first region of the carrier, removing a top surface of the carrier from the second region of the carrier and forming an adhesive layer over the first substrate forming layer throughout the first and second regions of the carrier. The method also includes forming a second substrate forming layer over the adhesive layer throughout the first and second regions of the carrier, and separating the first substrate forming layer from the carrier.

20 Claims, 4 Drawing Sheets

(51) Int. Cl.
*C09J 5/00* (2006.01)
*H01L 51/00* (2006.01)
*H01L 51/56* (2006.01)
*B32B 37/00* (2006.01)
*H01L 27/32* (2006.01)

(56) References Cited

U.S. PATENT DOCUMENTS

| | | | | |
|---|---|---|---|---|
| 7,622,367 B1 * | 11/2009 | Nuzzo | B82Y 10/00 | 257/E21.122 |
| 7,719,496 B2 * | 5/2010 | Ahn | B82Y 30/00 | 257/40 |
| 7,982,296 B2 * | 7/2011 | Nuzzo | B82Y 10/00 | 257/466 |
| 8,188,474 B2 * | 5/2012 | Hatano | H01L 27/1214 | 257/222 |
| 8,236,465 B2 * | 8/2012 | Wang | G02B 5/201 | 427/162 |
| 8,318,533 B2 * | 11/2012 | Ahn | B82Y 30/00 | 257/E51.006 |
| 8,339,573 B2 * | 12/2012 | Theis | G03F 7/70791 | 355/53 |
| 8,454,851 B2 * | 6/2013 | Kim | G02F 1/133305 | 216/13 |
| 8,455,872 B2 * | 6/2013 | French | H01L 27/1248 | 257/59 |
| 8,557,637 B2 * | 10/2013 | Chen | H01L 51/003 | 438/113 |
| 8,581,265 B2 * | 11/2013 | Hatano | H01L 27/1214 | 257/13 |
| 8,698,193 B2 * | 4/2014 | Arai | H01L 21/26506 | 257/103 |
| 8,961,255 B2 * | 2/2015 | Tang | G02F 1/133351 | 313/504 |
| 9,000,442 B2 * | 4/2015 | Hatano | H01L 27/1266 | 257/72 |
| 9,000,443 B2 * | 4/2015 | Hatano | H01L 51/5243 | 257/72 |
| 9,039,476 B2 * | 5/2015 | Song | H01L 51/003 | 313/507 |
| 9,076,822 B2 * | 7/2015 | Loy | H01L 21/6835 | |
| 9,117,976 B2 * | 8/2015 | Hatano | H01L 27/1214 | |
| 9,153,636 B2 * | 10/2015 | Tanaka | H01L 27/3276 | |
| 9,246,124 B2 * | 1/2016 | Khachatryan | G02F 1/133305 | |
| 9,276,047 B2 * | 3/2016 | Ko | H01L 27/3223 | |
| 9,278,512 B2 * | 3/2016 | Sun | B32B 38/10 | |
| 9,401,458 B2 * | 7/2016 | Hatano | H01L 27/1214 | |
| 9,419,065 B2 * | 8/2016 | Degner | H01L 27/326 | |
| 9,437,822 B2 * | 9/2016 | Lin | H01L 51/0017 | |
| 9,500,890 B2 * | 11/2016 | Kim | H01L 27/1266 | |
| 9,535,294 B2 * | 1/2017 | Lou | G02F 1/1339 | |
| 9,581,839 B2 * | 2/2017 | Yeo | G02F 1/1303 | |
| 9,599,852 B1 * | 3/2017 | Galstian | G02F 1/133526 | |
| 9,639,121 B2 * | 5/2017 | Min | G06F 1/1652 | |
| 9,640,763 B2 * | 5/2017 | Song | H01L 27/3262 | |
| 9,653,642 B1 * | 5/2017 | Raring | H01L 33/0075 | |
| 9,673,014 B2 * | 6/2017 | Kim | H01J 9/00 | |
| 9,697,764 B2 * | 7/2017 | Kim | H01L 51/52 | |
| 9,711,744 B2 * | 7/2017 | Wolk | H01L 51/0097 | |
| 9,721,825 B2 * | 8/2017 | Marrs | H01L 21/6835 | |
| 9,793,329 B2 * | 10/2017 | Hatano | H01L 27/3258 | |
| 2003/0222578 A1 * | 12/2003 | Cok | H01R 12/7076 | 313/512 |
| 2005/0068257 A1 * | 3/2005 | Stephenson | G02F 1/134327 | 345/50 |
| 2005/0253987 A1 * | 11/2005 | Stephenson, III | G02F 1/133512 | 349/113 |
| 2006/0108581 A1 * | 5/2006 | Ahn | B82Y 30/00 | 257/40 |
| 2006/0186512 A1 * | 8/2006 | Dekker | H01L 27/12 | 257/635 |
| 2008/0110862 A1 * | 5/2008 | Kim | G02F 1/133305 | 216/83 |
| 2008/0292786 A1 | 11/2008 | Hatano et al. | | |
| 2009/0219225 A1 * | 9/2009 | Cope | G09F 9/30 | 345/55 |
| 2009/0266471 A1 | 10/2009 | Kim et al. | | |
| 2010/0026198 A1 * | 2/2010 | Arai | H01L 21/26506 | 315/246 |
| 2010/0096633 A1 * | 4/2010 | Hatano | H01L 27/1214 | 257/59 |
| 2010/0197085 A1 * | 8/2010 | Ahn | B82Y 30/00 | 438/158 |
| 2011/0175101 A1 * | 7/2011 | Hatano | H01L 27/1266 | 257/72 |
| 2011/0175102 A1 * | 7/2011 | Hatano | H01L 27/1266 | 257/72 |
| 2011/0204361 A1 * | 8/2011 | Nishiki | H01L 21/268 | 257/52 |
| 2011/0227086 A1 * | 9/2011 | French | H01L 27/1266 | 257/59 |
| 2012/0038032 A1 * | 2/2012 | Dekker | H01L 27/12 | 257/623 |
| 2012/0082925 A1 * | 4/2012 | Wang | G02B 5/201 | 430/7 |
| 2012/0241799 A1 * | 9/2012 | Hatano | H01L 27/1214 | 257/98 |
| 2013/0011969 A1 * | 1/2013 | Chen | H01L 51/003 | 438/111 |
| 2013/0072079 A1 * | 3/2013 | Tang | G02F 1/133305 | 445/24 |
| 2013/0075739 A1 * | 3/2013 | Loy | H01L 21/6835 | 257/60 |
| 2014/0042406 A1 * | 2/2014 | Degner | H01L 27/326 | 257/40 |
| 2014/0124796 A1 * | 5/2014 | Hatano | H01L 27/1214 | 257/79 |
| 2014/0339527 A1 | 11/2014 | Lee et al. | | |
| 2014/0377939 A1 * | 12/2014 | Khachatryan | G02F 1/133305 | 438/479 |
| 2015/0021631 A1 | 1/2015 | Huh et al. | | |
| 2015/0029652 A1 * | 1/2015 | Min | G06F 1/1652 | 361/679.27 |
| 2015/0050758 A1 * | 2/2015 | Ko | H01L 27/3223 | 438/23 |
| 2015/0083312 A1 * | 3/2015 | Sun | B32B 38/10 | 156/248 |
| 2015/0137098 A1 * | 5/2015 | Tanaka | H01L 27/3276 | 257/40 |
| 2015/0138494 A1 * | 5/2015 | Kim | G02F 1/133305 | 349/138 |
| 2016/0035978 A1 * | 2/2016 | Lin | H01L 51/0017 | 257/88 |
| 2016/0141552 A1 * | 5/2016 | Chen | H01L 51/5253 | 257/40 |
| 2016/0164030 A1 * | 6/2016 | Yasuda | H01L 51/0097 | 349/122 |
| 2016/0181288 A1 * | 6/2016 | Smith | H01L 27/1218 | 600/395 |
| 2016/0187686 A1 * | 6/2016 | Lou | G02F 1/1339 | 349/61 |
| 2016/0195753 A1 * | 7/2016 | Yeo | G02F 1/1303 | 29/428 |
| 2016/0211450 A1 * | 7/2016 | Song | H01L 27/3262 | |
| 2016/0225653 A1 * | 8/2016 | Marrs | H01L 21/6835 | |
| 2016/0306393 A1 * | 10/2016 | Huitema | G06F 3/0346 | |
| 2016/0327987 A1 * | 11/2016 | Huitema | G06F 1/1652 | |
| 2016/0329389 A1 * | 11/2016 | Hatano | H01L 27/1214 | |
| 2016/0343939 A1 * | 11/2016 | Lin | H01L 51/0017 | |
| 2017/0033323 A1 * | 2/2017 | Chida | H01L 51/0097 | |
| 2017/0047534 A1 * | 2/2017 | Yoon | H01L 51/0097 | |
| 2017/0062717 A1 * | 3/2017 | Khachatryan | H01L 51/003 | |
| 2017/0076687 A1 * | 3/2017 | Lou | G09G 3/3677 | |
| 2017/0092884 A1 * | 3/2017 | Zhang | H01L 51/0097 | |
| 2017/0170242 A1 * | 6/2017 | Choi | H01L 27/323 | |

(56) References Cited

U.S. PATENT DOCUMENTS

2017/0293194 A1* 10/2017 Hou .................. G02B 1/14
2017/0294620 A1* 10/2017 Park .................. H01L 51/5253

FOREIGN PATENT DOCUMENTS

| KR | 10-2014-0085954 A | 7/2014 |
| KR | 10-2015-0009289 A | 1/2015 |
| KR | 10-2015-0105595 A | 9/2015 |

* cited by examiner

METHOD OF MANUFACTURING FLEXIBLE DISPLAY

CROSS-REFERENCE TO RELATED APPLICATION

This application claims the benefit of Korean Patent Application No. 10-2015-0112673, filed on Aug. 10, 2015, in the Korean Intellectual Property Office, the disclosure of which is incorporated herein in its entirety by reference.

BACKGROUND

Field

The described technology generally relates to a method of manufacturing a flexible display.

Description of the Related Technology

Due to a recent increase in market demand for flexible displays, research on these displays is being actively pursued. Such a flexible display is formed by using at least one layer of an organic material. It is generally lightweight, shock-resistant, and portable since it can be rollable or foldable.

The flexible display includes a display device formed on a flexible substrate. An organic light-emitting diode (OLED), a liquid crystal device, and an electrophoretic device may be used as display elements, and such display devices are electrically connected to many thin-film transistors (TFTs). For example, when an OLED display is manufactured, a TFT and a pixel electrode, an intermediate layer including an emission layer, and a common electrode facing the pixel electrode are formed into a pixel circuit which is replicated in a matrix.

However, since the flexible substrate includes a flexible material, it is difficult to handle due to bending or deformation during manufacture.

SUMMARY OF CERTAIN INVENTIVE ASPECTS

One inventive aspect relates to a method of manufacturing a flexible display that is easily separated from a carrier.

Another aspect is a method of manufacturing a flexible display apparatus, the method including: preparing a carrier including a first region and a second region surrounding the first region; forming a first substrate forming layer on at least the first region of the carrier; removing a top surface of the carrier from at least a part of the second region of the carrier; forming an adhesive layer on the first substrate forming layer throughout the first and second regions of the carrier; forming a second substrate forming layer on the adhesive layer throughout the first and second regions of the carrier; and separating the first substrate forming layer from the carrier.

The removing of the top surface of the carrier may include removing the top surface of the carrier from at least a part of the second region of the carrier, which contacts the first region of the carrier.

The forming of the first substrate forming layer may include coating a flexible substrate material on the carrier.

The forming of the second substrate forming layer may include coating a flexible substrate material on the adhesive layer.

The forming of the second substrate forming layer may include forming the second substrate forming layer by using a same material as the first substrate forming layer.

The forming of the adhesive layer may include forming the adhesive layer by using a transparent material.

The forming of the adhesive layer may include forming the adhesive layer by using an inorganic material.

The forming of the adhesive layer may include forming a first adhesive layer on the first region of the carrier, and a second adhesive layer on the second region of the carrier, the second adhesive layer including a part separated from the first adhesive layer.

The forming of the first substrate forming layer may include forming the first substrate forming layer by using an organic material, and the forming of the second substrate forming layer may include forming the second substrate forming layer by using a same material as the first substrate forming layer.

The carrier may include a glass material.

The separating of the first substrate forming layer may include separating the carrier and the first substrate forming layer from each other by irradiating a laser beam on a surface of the carrier, which is opposite to a surface where the first substrate forming layer is formed.

The removing of the top surface of the carrier may include removing the top surface of the carrier from at least a part of the second region of the carrier, which contacts the first region of the carrier, the forming of the adhesive layer may include forming a first adhesive layer on the first region of the carrier and a second adhesive layer separated from the first adhesive layer and located on the second region of the carrier, and the separating of the first substrate forming layer may include fracturing a part of the second substrate forming layer on the second adhesive layer.

The method may further include forming a display unit on the second substrate forming layer.

Another aspect is a method of manufacturing a flexible display, the method comprising: preparing a carrier comprising a first region and a second region surrounding the first region; forming a first substrate forming layer over at least the first region of the carrier; removing a top surface of the carrier from the second region of the carrier; forming an adhesive layer over the first substrate forming layer throughout the first and second regions of the carrier; forming a second substrate forming layer over the adhesive layer throughout the first and second regions of the carrier; and separating the first substrate forming layer from the carrier.

In the above method, the second region contacts the first region.

In the above method, the forming of the first substrate forming layer comprises coating a flexible substrate material on the carrier.

In the above method, the forming of the second substrate forming layer comprises coating a flexible substrate material on the adhesive layer.

In the above method, the forming of the second substrate forming layer comprises forming the second substrate forming layer with the same material as the first substrate forming layer.

In the above method, the forming of the adhesive layer comprises forming the adhesive layer with a transparent material.

In the above method, the forming of the adhesive layer comprises forming the adhesive layer with an inorganic material.

In the above method, the forming of the adhesive layer comprises: forming a first adhesive layer over the first region of the carrier; and forming a second adhesive layer over the second region of the carrier, wherein the second adhesive layer and the first adhesive layer are disconnected from each other.

In the above method, the forming of the first substrate forming layer comprises forming the first substrate forming layer with an organic material, wherein the forming of the second substrate forming layer comprises forming the second substrate forming layer with the same material as the first substrate forming layer.

In the above method, the carrier is formed of a glass material.

In the above method, the carrier includes a first surface facing the first substrate layer and a second surface opposing the first surface, wherein the separating of the first substrate forming layer comprises irradiating a laser beam on the second surface of the carrier.

In the above method, the forming of the adhesive layer comprises forming a first adhesive layer over the first region of the carrier and a second adhesive layer separated from the first adhesive layer and located on the second region of the carrier, wherein the separating of the first substrate forming layer comprises fracturing a part of the second substrate forming layer.

The above method further comprises forming a display unit on the second substrate forming layer.

Another aspect is a method of manufacturing a flexible display, the method comprising: preparing a carrier comprising a first region and a second region surrounding the first region; forming a first substrate forming layer over at least the first region of the carrier; removing a top portion of the carrier from the second region of the carrier; forming an adhesive layer over the entire first region and a portion of the second region; forming a second substrate forming layer over the adhesive layer that is formed over the first region and the portion of the second region; and separating the first substrate forming layer from the carrier.

In the above method, the adhesive layer includes a first adhesive layer formed over the first region and a second adhesive layer formed over the portion of the second region, wherein a bottom surface the first adhesive layer is located farther from a bottom surface of the carrier than a top surface of the second adhesive layer.

In the above method, the thicknesses of the first and second adhesive layers are substantially the same.

In the above method, the top surface of the second adhesive layer is closer to the bottom surface of the carrier than a top surface of the first region of the carrier.

The above method further comprises irradiating a laser beam on the first and second regions before separating the first substrate forming layer from the carrier.

In the above method, the separating includes separating a portion of the second substrate forming layer in the second region from the adhesive layer formed in portion of the second region.

In the above method, after the separating the first substrate forming layer from the carrier, a portion of the second substrate forming layer is connected to the adhesive layer formed in the portion of the second region.

DETAILED DESCRIPTION OF CERTAIN INVENTIVE EMBODIMENTS

Figure 1:
FIGS. 1, 2, 3, 4, 5, 6, 7 and 8 are cross-sectional views for describing a method of manufacturing a flexible display apparatus, according to an exemplary embodiment.

As the described technology allows for various changes and numerous embodiments, particular embodiments will be illustrated in the drawings and described in detail in the written description. However, this is not intended to limit the embodiments to particular modes of practice, and it will to be appreciated that all changes, equivalents, and substitutes that do not depart from the spirit and technical scope of the embodiments are encompassed in the embodiments. In the description, certain detailed explanations of related art are omitted when it is deemed that they may unnecessarily obscure the essence of the embodiments.

While such terms as "first", "second", etc., may be used to describe various components, such components must not be limited to the above terms. The above terms are used only to distinguish one component from another.

Reference will now be made in detail to exemplary embodiments, examples of which are illustrated in the accompanying drawings, wherein like reference numerals refer to like elements throughout. Thicknesses may be enlarged to clearly show several layers and regions in drawings. Also, for convenience of description, thicknesses of some layers and regions may be exaggerated in drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIGS. 1 through 8 are cross-sectional views for describing a method of manufacturing a flexible display, according to an exemplary embodiment.

Figure 2:
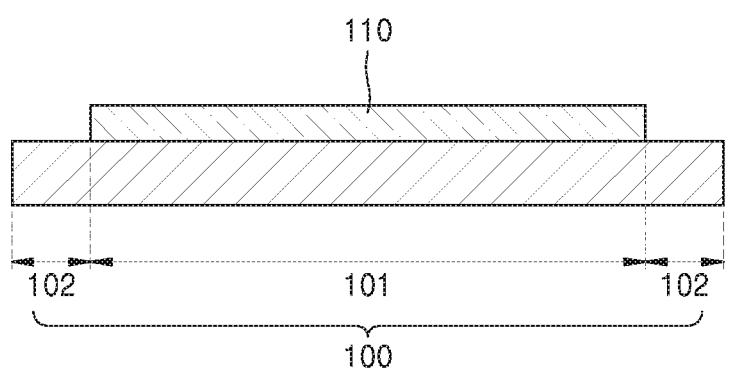

First, as shown in FIGS. 1 and 2, a carrier 100 including a first region 101 and a second region 102 is prepared. In this case, the second region 102 surrounds the first region 101.

The carrier 100 may be sufficiently thicker than a flexible substrate 130 that is to be placed on the carrier 100 later. Since the flexible substrate 130 is flexible, the flexible substrate 130 may bend or extend when heat or pressure is applied to the flexible substrate 130 while the flexible substrate 130 is manufactured or handled. In this case, it may be difficult to accurately form various electrodes or a thin-film pattern such as a conductive wire, on a pre-set location of the flexible substrate 130. Accordingly, in order to prevent bending or deformation of the flexible substrate 130 while the flexible substrate 130 is manufactured or handled, the carrier 100 may be a rigid substrate, for example, a thick-film type glass substrate.

Then, as shown in FIG. 2, a first substrate forming layer 110 is formed on the first region 101 of the carrier 100. In this case, the first substrate forming layer 110 may be one layer included in the flexible substrate 130 later.

Below is an example of a process of coating a flexible substrate material on a top surface of the carrier 100. The flexible substrate material may be an organic material, such as polyimide, polyethylene naphthalate, polyethylene terephthalate, polyether ether ketone, polyethersulfone, polymethylmethacrylate, polycarbonate, or polypropylene. Here, when polyimide that is heat-resistant and flexible is used, the flexible substrate 130 that is transparent may be formed.

A method of forming the first substrate forming layer 110 on the carrier 100 may vary, and for example, a method of coating and then hardening a liquid flexible substrate material may be used. At this time, the liquid flexible substrate material may be coated on the carrier 100 via a spin-coating method of a slit-coating method. As another example, a lamination method, in which a polyimide film and the carrier 100 pass between a plurality of rollers under heat and pressure, and thereafter the polyimide film is adhered on the carrier 100 may be used. In this case, a separate adhesive may not be used between the first substrate forming layer 110 and the carrier 100.

As shown in FIG. 2, the first substrate forming layer 110 is at least formed over the first region 101 of the carrier 100 (and optionally may be formed in the second region 102). For example, a first edge 110E (see FIG. 3) of the first substrate forming layer 110 may align with a boundary between the first and second regions 101 and 102 of the carrier 100.

According to another exemplary embodiment, while coating or laminating the first substrate forming layer 110 as described above, the first substrate forming layer 110 may be formed throughout only some of the first and second regions 101 and 102 of the carrier 100.

However, in the following exemplary embodiments and modified embodiments, it is described that the first substrate forming layer 110 is formed only in the first region 101 of the carrier 100 for convenience of description.

After forming the first substrate forming layer 110 on the carrier 100, the carrier 100, on which the first substrate forming layer 110 is formed, may be thermal-treated. Accordingly, bubbles and alien substances generated between the first substrate forming layer 110 and the carrier 100 may be removed, thereby preventing misalignment of the first substrate forming layer 110 located on the first region 101 of the carrier 100.

Figure 3:
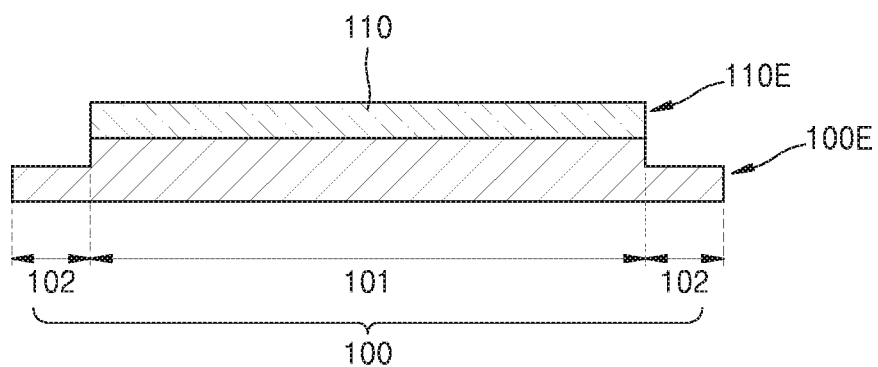

Then, as shown in FIG. 3, a top surface of the carrier 100 is removed from the second region 102 of the carrier 100.

Below is an example of a process of removing the top surface of the carrier 100 in at least a part of the second region 102 of the carrier 100, which contacts the first region 101 of the carrier 100. By removing the top surface of the carrier 100 from the second region 102, a height of the second region 102 of the carrier 100 may be lower than a height of the first region 101 of the carrier 100. Accordingly, the carrier 100 may have a stepped portion in which the height of the first region 101 is different from that of the second region 102.

A region from which the top surface is removed as described above may be a region of the second region 102 of the carrier 100, which extends from a boundary surface between the first and second regions 101 and 102 of the carrier 100 to a second edge 100E of the carrier 100. According to another exemplary embodiment, the region from which the top surface is removed may be located in a certain region adjacent to the boundary surface between the first and second regions 101 and 102 of the carrier 100 with respect to the second region 102 of the carrier 100.

A method of removing the top surface of the carrier 100 may vary, and may include, for example, a dry-etching process using gas, plasma, or ion beam.

Figure 4:
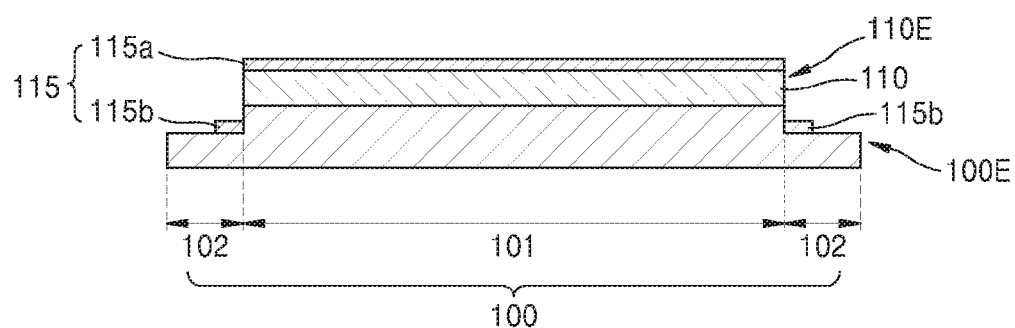

Then, as shown in FIG. 4, an adhesive layer 115 is formed throughout the first and second regions 101 and 102 of the carrier 100.

Below is an example of a process of forming the adhesive layer 115 by using an inorganic material. The inorganic material may be a (semi-) transparent material such that a laser beam LASER (see FIG. 6) passes through the adhesive layer 115. Examples of the inorganic material include amorphous silicon, indium tin oxide (ITO), indium zinc oxide (IZO), zinc oxide (ZnO), and indium oxide ($In_2O_3$). The adhesive layer 115 may have a single layer or multilayer structure including the materials above. Accordingly, in the second region 102 of the carrier 100, the laser beam LASER may be transmitted to a second substrate forming layer 120 (see FIG. 5) that is to be formed on the adhesive layer 115 later, thereby enabling the first substrate forming layer 110 from being separated from the second region 102 of the carrier 100.

A method of forming the adhesive layer 115 may vary, and a deposition method such as chemical vapor deposition (CVD) method or a sputtering method may be used.

When above-described process is used, the adhesive layer 115 includes a first adhesive layer 115a located on the first region 101 and a second adhesive layer 115b located on the second region 102. Here, the second adhesive layer 115b may include a region separated from the first adhesive layer 115a because, since the stepped portion in which the height of the first region 101 is different from that of the second region 102 is formed, the first adhesive layer 115a formed in the first region 101 and the second adhesive layer 115b formed in the second region 102 are separated from each other via a deposition method or a sputtering method.

The adhesive layer 115 is disposed between the second substrate forming layer 120 and the first substrate forming layer 110, and adheres the first and second substrate forming layers 110 and 120 to each other.

Figure 5:
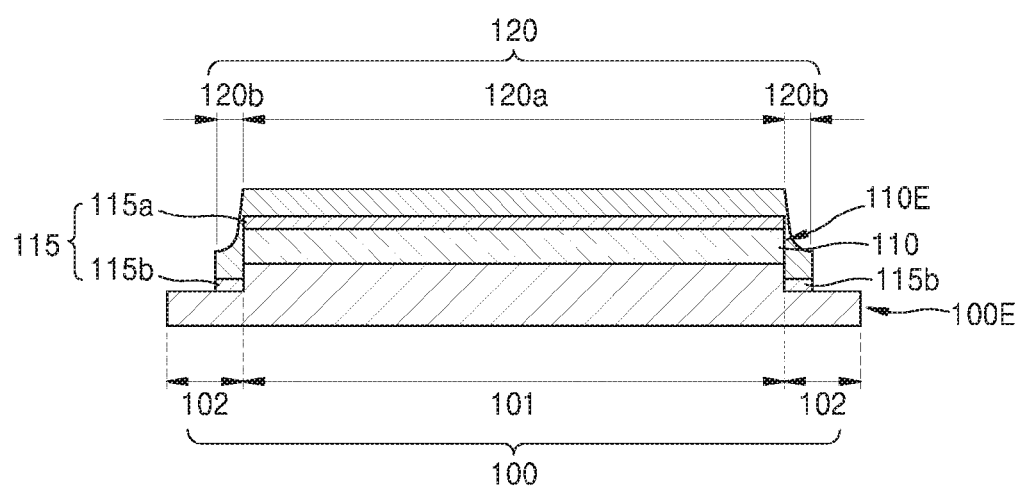

Then, as shown in FIG. 5, the second substrate forming layer 120 is formed throughout the first and second regions 101 and 102 of the carrier 100. Here, the second substrate forming layer 120 may be one layer included in the flexible substrate 130 later, like the first substrate forming layer 110.

Below is an example of a process of coating a flexible substrate material on a top surface of the adhesive layer 115. Like the material of the first substrate forming layer 110, the flexible substrate material may be an organic material, such as polyimide, polyethylene naphthalate, polyethylene terephthalate, polyether ether ketone, polyethersulfone, polymethylmethacrylate, polycarbonate, or polypropylene. According to an exemplary embodiment, the first and second substrate forming layers 110 and 120 may include the same material.

The second substrate forming layer 120 may be formed by the same method as the first substrate forming layer 110. For example, liquid polyimide may be coated or a polyimide film may be laminated on the adhesive layer 115.

When the second substrate forming layer 120 is formed by coating or laminating an organic material, the second substrate forming layer 120 may be continuously coated on the adhesive layer 115. In this case, the second substrate forming layer 120 may overflow on the second adhesive layer 115b over the first edge 110E of the first substrate forming layer 110. For example, the second substrate forming layer 120 may include a region 120a located on the first adhesive layer 115a and an overflow region 120b located on the second adhesive layer 115b.

The overflow region 120b gradually increases while thinly covering an edge of the first adhesive layer 115a and the first edge 110E by the stepped portion of the carrier 100 described above. Accordingly, internal stress of the overflow region 120b may gradually increase, and thus the overflow region 120b may be already cracked or may be about to crack.

Figure 6:
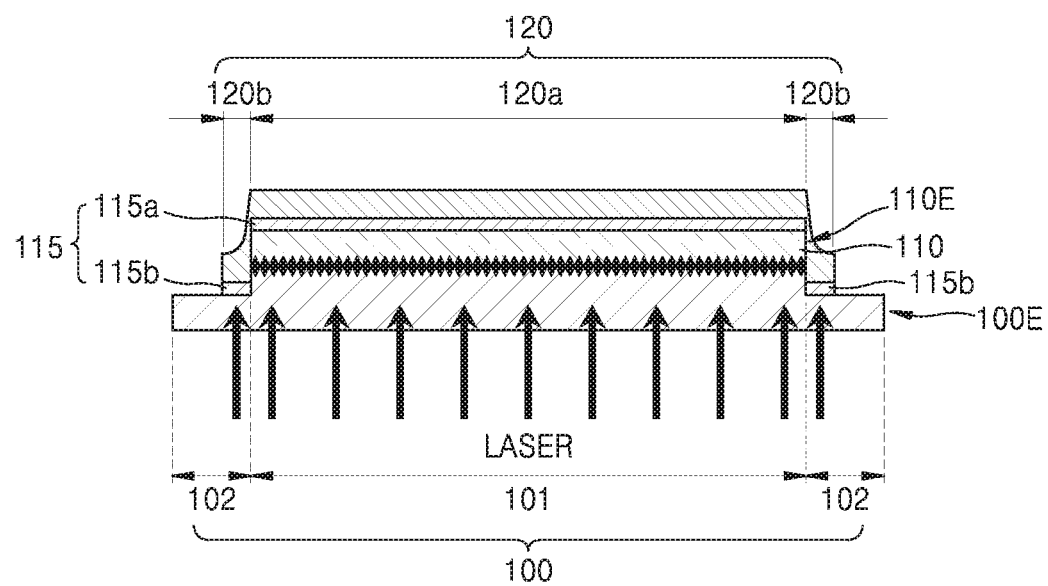
Figure 7:
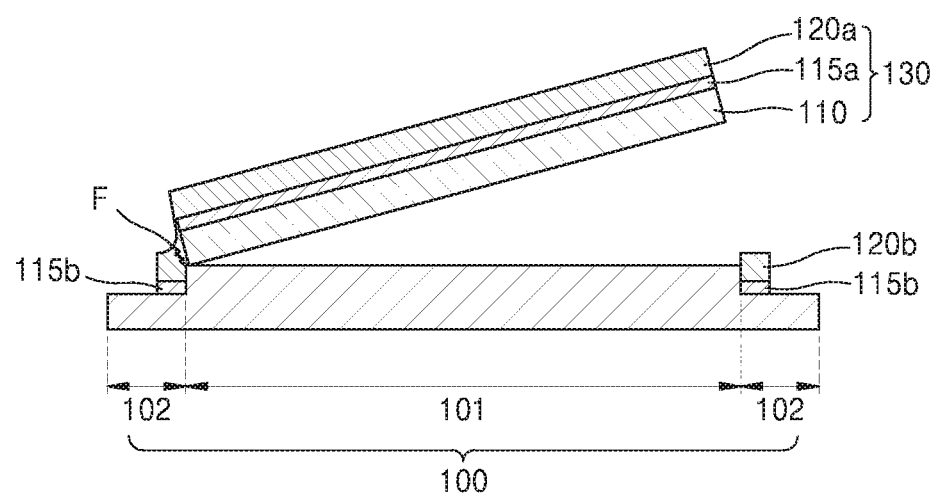

Then, as shown in FIGS. 6 and 7, the first substrate forming layer 110 is separated from the carrier 100.

Below is an example of a process of separating the carrier 100 and the first substrate forming layer 110 from each other by irradiating the laser beam LASER on a surface of the carrier 100, which is opposite to a surface where the first substrate forming layer 110 is formed.

A light source of the laser beam LASER is disposed adjacent to the carrier 100, and then a focus of the laser beam LASER is adjusted to be on a boundary surface between the first substrate forming layer 110 and the carrier 100. Strength of the laser beam LASER and a depth of focus (DOF) using an optical system are adjusted, thereby focusing light on the boundary surface between the first substrate forming layer 110 and the carrier 100. For example, a laser may be an excimer-based laser. In this case, a bottom surface of the carrier 100 may be scanned by an excimer laser beam such that the excimer laser beam is irradiated on an entire surface or pre-set portions of the boundary surface between the first substrate forming layer 110 and the carrier 100.

The laser beam LASER is irradiated between the carrier 100 and the first substrate forming layer 110, thereby separating the carrier 100 and the first substrate forming layer 110 from each other by using an energy absorption difference between a material of the carrier 100 and a material of the first substrate forming layer 110. For example, the laser beam LASER that passed through the carrier 100 is focused on and absorbed by the first substrate forming layer 110 having higher energy absorption than the carrier 100, molecules adjacent to a surface of the first substrate forming layer 110 are decomposed, and thus adhesion between the first substrate forming layer 110 and the carrier 100 is decreased. Accordingly, the flexible substrate 130 using the first substrate forming layer 110 as a base may be separated from the carrier 100.

At this time, while separating the first substrate forming layer 110 from the carrier 100, the second substrate forming layer 120 may easily fracture. As described above, the overflow region 120b of the second substrate forming layer 120 may already be cracked or may be about to crack at a certain location F of the overflow region 120b. Then, the overflow region 120b of the second substrate forming layer 120 may be fractured as such a crack may grow at the certain location F of the overflow region 120b. Accordingly, the flexible substrate 130 may be easily separated from the carrier 100 such that an edge of the flexible substrate 130 is substantially linear.

Accordingly, the stepped portion of the carrier 100 may have at least a certain size. If the stepped portion of the carrier 100 is too small or does not exist, it is not easy to separate the overflow region 120b of the second substrate forming layer 120 from the carrier 100, and thus the edge of the flexible substrate 130 may be partially torn or unclean. Also, the flexible substrate 130 may be easily deformed due to an impact during separation.

Figure 8:
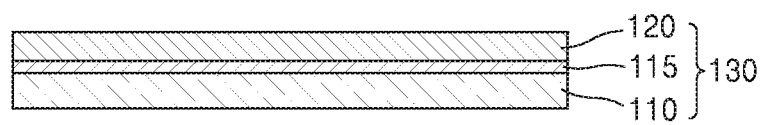

As shown in FIG. 8, the flexible substrate 130 may have a structure in which the first substrate forming layer 110, the adhesive layer 115, and the second substrate forming layer 120 are sequentially stacked on each other. By forming the flexible substrate 130 in a multilayer structure formed of a flexible material, internal contamination may be reduced, and handling may be easy by obtaining certain strength.

Hereinabove, a method of manufacturing the flexible substrate 130 by forming the stepped portion in the carrier 100 during processes is described, but an exemplary embodiment is not limited thereto. For example, the carrier 100 may be prepared including the stepped portion from the beginning of the entire process to manufacture the flexible substrate 130.

Meanwhile, the method may further include disposing a display unit 200 between the disposing of the second substrate forming layer 120 on the adhesive layer 115 of FIG. 5 and the separating of the first substrate forming layer 110 from the carrier 100 of FIG. 6. The display unit 200 may be formed on the second substrate forming layer 120 of the flexible substrate 130. Hereinbelow, for convenience of description, a structure of the display unit 200 will be described when an organic light-emitting device is used as a display device.

Figure 9:
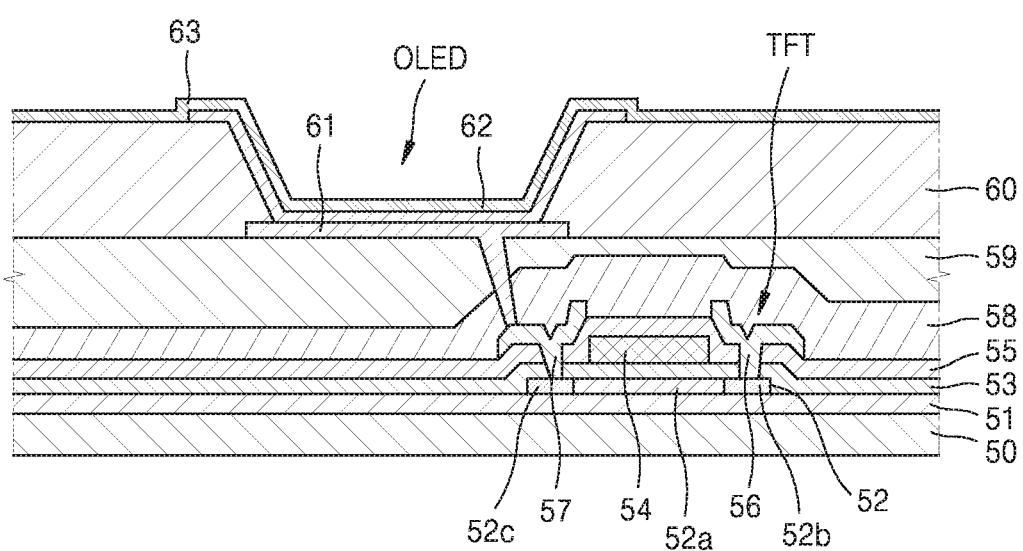
FIG. 9 is a cross-sectional view of a flexible display apparatus according to an exemplary embodiment.

FIG. 9 is a cross-sectional view of a flexible display according to an exemplary embodiment.

Referring to FIG. 9, various components of a flexible OLED display according to an exemplary embodiment are formed on a substrate 50. Here, the flexible substrate 50 may be the flexible substrate 130 described above with reference to FIGS. 1 through 7, or a region of the flexible substrate 130 obtained by cutting the flexible substrate 130.

A common layer, such as a buffer layer 51, a gate insulating film 53, and an interlayer insulating film 55, may be formed on the entire surface of the substrate 50. A patterned semiconductor layer 52 including a channel region 52a, a source contact region 2b, and a drain contact region 52c may be formed on the substrate 50, wherein together with the patterned semiconductor layer 52, a gate electrode 54, a source electrode 56, and a drain electrode 57 forming a thin-film transistor TFT may be formed.

Also, a protection film 58 covering the thin-film transistor TFT and a planarization film 59 located on the protection film 58 and having an approximately flat surface may be formed on the entire surface of the substrate 50. An OLED including a patterned pixel electrode 61, a counter electrode 63 formed on substantially the entire surface of the substrate 50, and an intermediate layer 62 disposed between the patterned pixel electrode 61 and the counter electrode 63 and having a multilayer structure including an emission layer may be formed on the planarization film 59.

Here, unlike shown in FIG. 9, some of the intermediate layer 62 may be a common layer formed on substantially the entire surface of the substrate 50, and the remaining of the intermediate layer 62 may be a pattern layer patterned to correspond to the patterned pixel electrode 61. The patterned pixel electrode 61 may be electrically connected to the thin-film transistor TFT through a via-hole. Here, a pixel-defining film 60 having an opening defining each pixel region while covering an edge of the patterned pixel electrode 61 may be formed on the planarization film 59 to approximately correspond to the entire surface of the substrate 50.

Such a flexible OLED display may be manufactured by using the method of manufacturing the flexible substrate 130 according to one or more exemplary embodiments described above.

According to at least one of the disclosed embodiments described above, since a flexible substrate is easily separated from a carrier, defects of the flexible substrate from being unseparated may be prevented.

While the inventive technology has been described with reference to the figures, it will be understood by those of ordinary skill in the art that various changes in form and details may be made therein without departing from the spirit and scope as defined by the following claims.

What is claimed is:

1. A method of manufacturing a flexible display, the method comprising:
   preparing a carrier comprising a first region and a second region surrounding the first region;
   forming a first substrate forming layer over at least the first region of the carrier;
   removing a top surface of the carrier from the second region of the carrier;
   forming an adhesive layer over the first substrate forming layer throughout the first and second regions of the carrier;
   forming a second substrate forming layer over the adhesive layer throughout the first and second regions of the carrier; and
   separating the first substrate forming layer from the carrier.

2. The method of claim 1, wherein the second region contacts the first region.

3. The method of claim 1, wherein the forming of the first substrate forming layer comprises coating a flexible substrate material on the carrier.

4. The method of claim 1, wherein the forming of the second substrate forming layer comprises coating a flexible substrate material on the adhesive layer.

5. The method of claim 1, wherein the forming of the second substrate forming layer comprises forming the second substrate forming layer with the same material as the first substrate forming layer.

6. The method of claim 1, wherein the forming of the adhesive layer comprises forming the adhesive layer with a transparent material.

7. The method of claim 1, wherein the forming of the adhesive layer comprises forming the adhesive layer with an inorganic material.

8. The method of claim 1, wherein the forming of the adhesive layer comprises:
   forming a first adhesive layer over the first region of the carrier; and
   forming a second adhesive layer over the second region of the carrier, and
   wherein the second adhesive layer and the first adhesive layer are disconnected from each other.

9. The method of claim 1, wherein the forming of the first substrate forming layer comprises forming the first substrate forming layer with an organic material, and
   wherein the forming of the second substrate forming layer comprises forming the second substrate forming layer with the same material as the first substrate forming layer.

10. The method of claim 1, wherein the carrier is formed of a glass material.

11. The method of claim 1, wherein the carrier includes a first surface facing the first substrate layer and a second surface opposing the first surface, and wherein the separating of the first substrate forming layer comprises irradiating a laser beam on the second surface of the carrier.

12. The method of claim 1, wherein the forming of the adhesive layer comprises forming a first adhesive layer over the first region of the carrier and a second adhesive layer separated from the first adhesive layer and located on the second region of the carrier, and
   wherein the separating of the first substrate forming layer comprises fracturing a part of the second substrate forming layer.

13. The method of claim 1, further comprising forming a display unit on the second substrate forming layer.

14. A method of manufacturing a flexible display, the method comprising:
   preparing a carrier comprising a first region and a second region surrounding the first region;
   forming a first substrate forming layer over at least the first region of the carrier;
   removing a top portion of the carrier from the second region of the carrier;
   forming an adhesive layer over the entire first region and a portion of the second region;
   forming a second substrate forming layer over the adhesive layer that is formed over the first region and the portion of the second region; and
   separating the first substrate forming layer from the carrier.

15. The method of claim 14, wherein the adhesive layer includes a first adhesive layer formed over the first region and a second adhesive layer formed over the portion of the second region, and wherein a bottom surface the first adhesive layer is located farther from a bottom surface of the carrier than a top surface of the second adhesive layer.

16. The method of claim 15, wherein the thicknesses of the first and second adhesive layers are substantially the same.

17. The method of claim 16, wherein the top surface of the second adhesive layer is closer to the bottom surface of the carrier than a top surface of the first region of the carrier.

18. The method of claim 14, further comprising irradiating a laser beam on the first and second regions before separating the first substrate forming layer from the carrier.

19. The method of claim 18, wherein the separating includes separating a portion of the second substrate forming layer in the second region from the adhesive layer formed in portion of the second region.

20. The method of claim 19, wherein, after the separating the first substrate forming layer from the carrier, a portion of the second substrate forming layer is connected to the adhesive layer formed in the portion of the second region.

* * * * *